Figure 1:
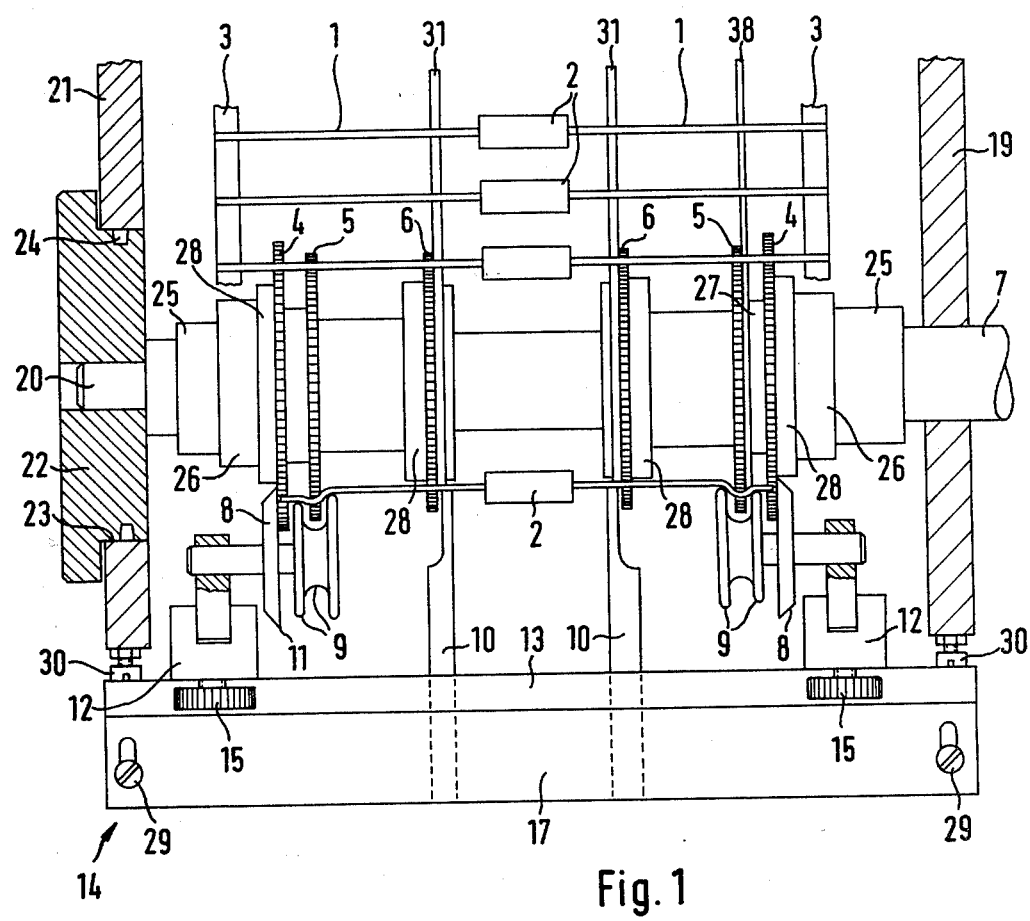

United States Patent [19]

Weresch

[11] 4,221,244

[45] Sep. 9, 1980

[54] APPARATUS FOR CUTTING TO LENGTH, CRIMPING AND/OR BENDING THE CONNECTING WIRES OF ELECTRIC COMPONENTS

[76] Inventor: Thomas Weresch, Greschbachstr. 19, D-7500 Karlsruhe 41, Fed. Rep. of Germany

[21] Appl. No.: 18,503

[22] Filed: Mar. 8, 1979

[30] Foreign Application Priority Data

Apr. 1, 1978 [DE] Fed. Rep. of Germany ....... 2814100

[51] Int. Cl.$^3$ ............................................. B21F 45/00
[52] U.S. Cl. .............................. 140/105; 72/DIG. 10
[58] Field of Search ................................. 140/71, 105; 72/DIG. 10

[56] References Cited

U.S. PATENT DOCUMENTS

| 2,450,920 | 10/1948 | Shand | 140/71 R |
| 3,900,053 | 8/1975 | Weresch | 140/105 |

Primary Examiner—Lowell A. Larson
Attorney, Agent, or Firm—Craig and Antonelli

[57] ABSTRACT

Apparatus for mechanically processing (cutting to length, crimping and/or bending) the connecting wires of electrical components and being of a generally similar nature to that of U.S. Pat. No. 3,900,053. The present invention, however, provides for the various toothed wheels, which are mounted on a rotatable main shaft, to be readily removable for the purpose of exchanging them for others in order to adapt the apparatus to the processing of different components. To this end, the toothed wheels are mounted on sleeves on the main shaft and the latter has a bearing arrangement at one end which includes a detachable bearing plate mounted in a aperture in the apparatus housing, which allows the toothed wheels to be drawn off the main shaft over that end and through the aperture when the bearing plate is detached and the toothed wheels unclamped from the main shaft. Also, the cutting, crimping and bending tools, which cooperate with respective ones of the toothed wheels (namely, transporting, crimping and bending wheels) are supported directly on the apparatus housing and are positionally adjustable independently of the toothed wheels. Various other features are described, including an improved form and arrangement of counter-holders for control of processing forces and providing ramps for the ejection of the connecting wires from the toothed wheels when they have passed the tools, and the provision of both main and auxiliary cross-members, the latter for supporting additional tools, possibly including impact tools.

10 Claims, 2 Drawing Figures

APPARATUS FOR CUTTING TO LENGTH, CRIMPING AND/OR BENDING THE CONNECTING WIRES OF ELECTRIC COMPONENTS

The invention relates to apparatus for mechanically processing (cutting to length, crimping and/or bending) the connecting wires of electrical components, the apparatus comprising toothed transporting wheels receiving in spaces between their teeth the connecting wires which are to be processed, and also (where the apparatus is to be capable of bending and/or crimping the wires) toothed bending wheels and/or crimping wheels, said wheels all being arranged coaxially, adapted to be driven in rotational movement by a common main shaft mounted in a housing, and adapted to be adjusted in the axial direction of the main shaft and clamped in position, and further comprising cutting, crimping and/or bending tools which are arranged secured to the housing and are adapted to be adjusted in the direction of the main shaft and clamped in position and to co-operate correspondingly in each case with the toothed transporting, crimping or bending wheels.

The electrical components which are processed with apparatus of the type described are usually resistances, capacitors, diodes etc., that is to say elements which generally although not necessarily comprise two connecting wires each, these wires standing out diametrally from one another and normally being arranged coaxially with one another and with the body of the component. These elements may be supplied individually or arranged in a row as a belt of such components. Generally, components of this kind are supplied by the manufacturer in a form where they cannot be fitted straight away into a circuit arrangement by the user. The connecting wires are more or less straight and usually have a considerable amount of oversize. Therefore they have to be cut to the intended size and bent. It is also usual to provide electrical components for mounting in printed circuit arrangements or the like with little "feet" formed in connecting wires, which in the context of the present invention will be referred to as crimps, so that they can be inserted in a conductor plate sufficiently securely before soldering. There are various possible ways of carrying out the bending of the connecting wires and the formation of crimps, and these will not be discussed in detail.

It is known (see German laid-open specification No. 24 00307) to carry out the cutting to length, crimping and/or bending of connecting wires, by means of an apparatus of the type described initially, more or less in a single operation and in so doing to achieve an extremely high throughput of components. The components are received in the spaces between the teeth of the various coaxially arranged toothed wheels, conducted past the tools which are secured to the housing, and thereby cut to length, crimped and bent. Usually a complete set of toothed wheels—transporting wheel, crimping wheel and bending wheel—is provided for each connecting wire. Cutting tools are associated with the transporting wheels, crimping tools with the crimping wheels, and bending tools with co-called bending fingers are associated with the bending wheels, and these come into action in accordance with their situation on the periphery of the toothed wheels and the direction of rotation at different times but at short intervals one after the other. Often the cutting and crimping tools are connected with one another and constructed as profiled rollers which comprise a cutting edge associated with the toothed transporting wheels and also one or more shoulders associated with the toothed crimping wheels.

When changing-over to the processing of other components or components intended for different circuit use, it is usually necessary for the toothed wheels and also the tools to be displayed, in accordance with the intended length circumstances, in the axial direction of the main shaft and clamped fast appropriately. It is also often necessary to interchange toothed wheels and/or tools, for example if different kinds of bend or different shapes of crimps have to be produced.

The aforesaid publication does not concern itself with these conversion problems. In an actual constructional form which is known (from actual practice) of such an apparatus of the type initially described the toothed transporting wheels are connected rotatably by means of toothed wheel guide rollers engaging over them peripherally with special guide elements which are also capable of axial displacement on the main shaft. The crimping and cutting tools are arranged on these guide elements and consequently can be adjusted in one operation together with the toothed transporting wheels and the toothed crimping wheels connected therewith. In this way it is true that the axial arrangement of these toothed wheels with the associated tools is relatively simple but it is more difficult to replace one of the toothed wheels since for that purpose the entire main shaft and the guide elements with the tools have to be dismantled. In addition, these known measures impair the stability of the apparatus, so that difficulties may arise when dealing with components which have very thick connecting wires, for example power diodes. On the one hand the association between toothed transporting wheels and crimping wheels and the cutting and crimping tools by way of the guide elements is not sufficiently rigid. On the other hand the connection between guide elements and toothed transporting wheels has the result that these are unsupported over a relatively considerable portion of their diameter, so that problems may arise in the case of considerable processing forces.

The invention has as its object to provide apparatus of the type described initially herein which can be converted in a simple manner and more particularly in a very short space of time and is noteworthy for robust construction, and which also allows the processing of the thickest connecting wires likely to occur in actual practice without any difficulty. In this connection, the importance of a simple conversion possibility is particularly to be noted, since the extremely high capacity of the known apparatus of the type specified can be used to the optimum extent only if conversion between different processing batches can be carried out with suitable speed.

This object is achieved according to the present invention in that the main shaft is detachable from the bearing arrangement by means of a removal end, that the toothed wheels can be removed from the main shaft over the removal end when the clamping arrangement is released, and that the cutting, crimping and bending tools are supported directly on the housing and are adjustable independently of the toothed wheels in the axial direction of the main shaft. Thus the invention in the first instance allows the possibility, without dismounting the main shaft, of removing the toothed wheels from the main shaft for conversion purposes by arranging the said shaft to be detachable from its bearing arrangement at one end which, in the context of the present invention, is referred to as the removal end. This can be achieved in various ways which will be discussed hereinafter. According to a feature of the invention it is also possible in principle to support the main shaft only at one end, but this is generally not advisable for stability reasons. Unhindered changing of the toothed wheels is made possible by the fact that these are completely separate from the tools, since in fact the tools are supported directly on the housing and are adjustable independently of the toothed wheels. The necessary closed system of forces between toothed wheels and tools is achieved not directly by way of suitable guide elements as in the known apparatus, but indirectly through the main shaft, bearing arrangement and housing. The result of this is to give much improved stability and robustness in construction, and it is also possible to avoid tilting moments which in the known apparatus occur in an unavoidable way in the guide elements and reduce the processing accuracy, and finally according to the invention it is also possible to arrange the toothed wheels independently of the requirements of a coupling to the tools in such a way that they can easily accept the forces which occur. Moreover, the entire construction of the apparatus is substantially simplified and easier to supervise.

For releasing the removal end of the main shaft on the bearing arrangement there are various possible methods. An arrangement is basically advisable wherein the removal end of the main shaft is made accessible in that its axis extends through the aperture in the housing, the removal end being mounted in a detachable bearing plate. The arrangement may be made such that the main shaft ends at a spacing from the internal wall of the housing and is mounted in a bearing plate extending inwardly through the housing aperture, the arrangements being such that when the bearing plate is removed the toothed wheels can be removed through the space between the removal end and the internal wall of the housing. A particularly advantageous constructional form consists in that the toothed wheels can be removed through the housing aperture, and the removal end itself can project into the housing aperture. The bearing plate can be held by means of radial holding screws engaging in a peripheral groove or with a flange placed on the external wall of the housing, and in any case is centred in the housing aperture preferably with a suitable collar.

The toothed transporting and crimping wheels, which are usually connected to one another and are adjusted jointly, can be fixed on a common external sleeve with an interposed spacer disc. This external sleeve can be arranged to be sucured to an internal sleeve for rotation therewith and also to be axially displaceable and clampable on the internal sleeve which itself is adjustable and carries the corresponding toothed bending wheel. The toothed wheels are fixed with faces thereof on end faces of these sleeves or collars connected thereto. It is advisable to support the toothed wheels on a supporting diameter which corresponds substantially to the root circle diameter of the corresponding system of teeth. This is true more particularly of the transporting wheels which, during the cutting of the connecting wires, have to accept relatively high stresses and wherein it is only necessary to ensure that between the sleeve periphery and the base of the teeth sufficient space is available for belt strips which may be used to convey the components in a string. This support over a large surface area, which is made possible by the measures according to the invention explained hereinbefore, gives a much better load-accepting ability for the toothed wheels.

The various tools associated with the toothed wheels are preferably guided in such manner as to be capable of displacement and of being clamped in position on a main cross-member parallel to the main shaft, and this main cross-member is adapted to be clamped securely to the housing and, when the clamping arrangement is released, is adapted to be displaced at right-angles to the main shaft against adjustable abutments. The processing forces which occur at the tools are introduced into the housing of the apparatus according to the present invention by way of this clamped main cross-member. When the clamping arrangement is released, the main cross-member can be pushed back together with the tools so that the toothed wheels are freed from the tools and can be interchanged in the manner explained. Then the main cross-member is moved back in the direction towards the main shaft against the correspondingly adjusted abutments, so that the tools are again in the working position. The tools themselves in every case are supported and guided independently of the toothed wheels on the cross-member and are also each individually adjustable in directions parallel to and perpendicular to the main shaft. The main cross-member is preferably L-shaped in cross-section with a horizontal leg and a vertical leg, and in a particularly advantageous manner the cutting and crimping tools are mounted on the vertical leg and are adjustable radially by means of a screw spindle whilst the bending tools are mounted on the horizontal leg by means of a vertical dovetail guide arrangement.

The arrangement according to the invention ensures that the main shaft is accessible to a very considerable extent. There is the advantageous possibility of additionally providing an auxiliary cross-member which is arranged above the main shaft and offset by about 90° relatively to the main cross-member, and is adapted to hold additional tools. These additional tools may be in the first instance further bending and/or crimping tools, but it is even possible, making use of the stability of the arrangement according to the invention, to provide an impact or pressure tool to provide flattened portions on the connecting wires if necessary. It is also advisable for the auxiliary cross-member to be made capable of being securely clamped like the main cross-member and such that it can be disengaged when the clamping arrangement is released.

It is known in apparatus of the type specified to provide counter-holders which are mounted on an auxiliary shaft integral with the housing and parallel to the main shaft, are under spring action directed towards the tools and are provided with a tension relief nose and/or an ejector. These counter-holders are used on the one hand for keeping undue stresses away from the body of the electrical component when the connecting wires are being processed, and on the other hand for reliably throwing out the components after processing. Usually two counter-holders are provided, one for each set of tools, and they engage with a suitably adapted contour in a peripheral groove provided on the bending wheels and are guided thereby. In the known constructional form the counter-holders are each supported on the auxiliary shaft with a rearwardly open fork. But when it is necessary to change the toothed wheels this arrangement is found to be very cumbersome since the counter-holders can only be dismounted with difficulty. In this respect the invention also teaches that each counter-holder comprises a cranked portion at its end remote from the main shaft and is mounted with the cranked portion on the auxiliary shaft, and that the spring action on the counter-holder has a projection whereby the cranked portion is elastically locked. The cranked portion is preferably upwardly open and is thus pushed over the auxiliary shaft from below and held fast on the auxiliary shaft by the projection of the spring. At the same time the counter-holder is pushed forwardly by this spring until the rear boundary of the cranked portion abuts on the auxiliary shaft, so that the said counter-holder is pushed back elastically against the spring force when corresponding processing forces occur.

The independent guiding and adjustment of the tools proposed by the present invention affords the further advantageous possibility of arranging one of the crimping tools before the other crimping tool in the direction of rotation—usually by 2 to 5 mm—and associating with the forward creasing tool in the direction of rotation an auxiliary counter-holder which comprises a crimping guide. In this context "crimp guide" means a construction of the auxiliary counter-holder in such a manner that the crimp just formed by the appropriate crimping tool is guided into a specific position. A particularly simple and effective form of crimp guide consists of a ramp which is formed on the auxiliary counter-holder between the crimping tools in the direction of rotation. The auxiliary counter-holder is preferably arranged between the toothed transporting wheel and the toothed crimping wheel and guided in an annular groove of an intermediate ring situated between the toothed transporting wheel and the toothed crimping wheel.

Figure 2:
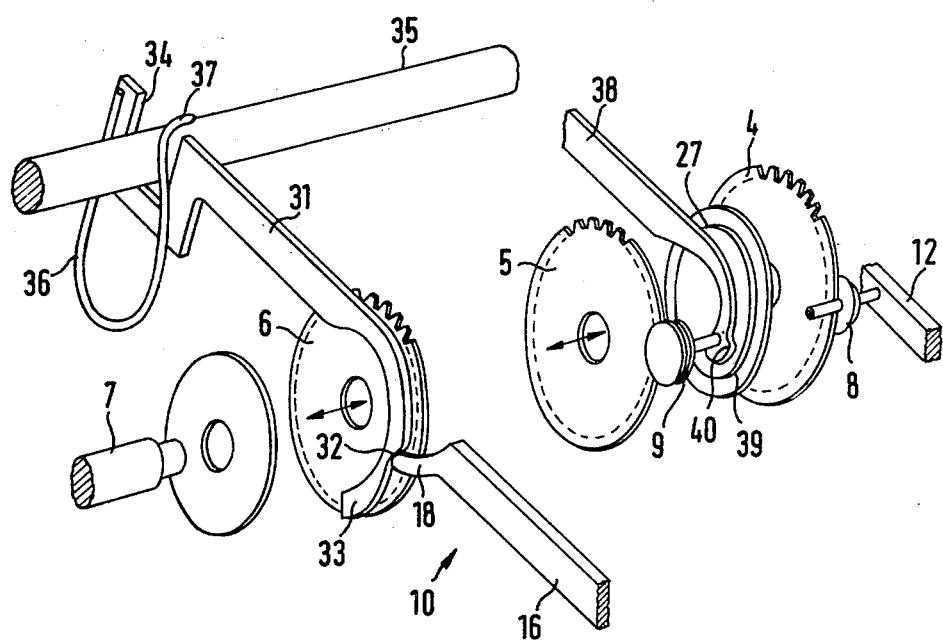

The invention wil now be described, by way of example, with reference to the accompanying drawings, in which:

FIG. 1 shows a plan view of an apparatus for cutting to length, crimping and bending the connecting wires of electrical components; and FIG. 2 shows a perspective exploded view of a part of the apparatus according to FIG. 1.

The apparatus shown in the drawings is used for cutting to length, crimping and bending the connecting wires 1 of electrical components which in the constructional example are resistances 2, which are fed-in strung in a belt by means of adhesive tapes 3.

To process each connecting wire 1 there is provided a set of toothed wheels comprising transporting wheel 4, crimping wheel 5 and bending wheel 6. All the toothed wheels 4, 5, 6 are arranged coaxially relatively to one another and can be driven in rotational movement by a common main shaft 7. Associated with the toothed wheels 4, 5, 6 are tools which are arranged secured to the housing, namely cutting tools 8 with the transporting wheels 4, crimping tools 9 with the crimping wheels and bending tools 10 with the bending wheels. The cutting and crimping tools 8, 9 are combined to form a composite cutting/crimping tool which is of rotationally symmetrical construction and comprises a truncated cone with a cutting edge 11 and the actual crimping tool 9 which is integrally connected therewith, the said cutting edge co-operating with the transporting wheel 4. The cutting/crimping tools 8, 9 are mounted to be freely rotatable each in a holder 12, these being disposed on the vertical legs 13 of a cross-member 14 of L-shaped form in cross-section, adjustable in the axial direction of the main shaft 7 and also radially adjustable relatively to the main shaft 7 by means of an adjusting screw 15 in each case. The bending tools 10 each consist of a shank 16 which is secured by means of a dovetail guide (not shown) on the horizontal leg 17 of the cross-member 14 and is likewise adjustable radially and axially, and also a bending finger 18 which is formed on the front side of the shank 16 and co-operates with the respective bending wheel 6. Thus all the tools 8, 9, 10 are supported directly on the housing independently of the main shaft 7 and the toothed wheels 4, 5, 6 and are adjustable independently of the toothed wheels 4, 5, 6 in the axial direction of the main shaft 7—and also radially thereto.

The apparatus illustrated operates basically in such manner that the components 2 are deposited with the connecting wires 1 in the spaces between the teeth of the toothed wheels 4, 5, 6 and are taken by those wheels past the tools 8, 9, 10, so that the processing is carried out by the co-operation of the toothed wheels with the respective tools. By suitable arrangement of the tools 8, 9, 10 the processing operations are staggered in time, usually in such a manner that the connecting wires 1 are first cut to length by the transporting wheel 4 and cutting tool 8 and at the same time separated from the adhesive tapes 3 of the belt, then formed with a crimping between the crimping wheel 5 and the crimping tool 9 and finally bent by the bending wheel 6 over the bending finger 18. On further rotation of the toothed wheels the components 2, which have now been processed, are released and ejected. Adaptation to different component dimensions and processing tasks is effected by the fact that—as already explained—the tools 8, 9, 10 can be adjusted radially axially, and also the toothed wheels 4, 5, 6 can be adjusted in the axial direction of the main shaft 7 and clamped and also exchanged with others if necessary.

The main shaft 7 is mounted at one side in the usual way in a housing wall 19 and adapted to be driven by a drive motor not shown here. The other end of the main shaft 7, referred to in this text as the removal end 20, is not mounted directly in the corresponding housing wall 21 but in a bearing plate 22 which itself is centred in a housing aperture 23 of the housing wall 21 and fixed by means of a screw (not shown) engaging radially in a peripheral groove 24. By removing the bearing plate 22 from the aperture 23 the removal end 20 of the main shaft 7 can be detached from the bearing arrangement and, since the internal clear diameter of the housing aperture 23 is appropriately dimensioned, the toothed wheels 4, 5, 6, in order to be exchanged, can be removed over the removal end 20 and through the housing aperture 23.

The toothed wheels 4, 5, 6 are fixed for this purpose with faces thereof on the end faces of sleeves 25, 26 which themselves are adapted to be displaced on the main shaft and to be clamped thereon for rotation therewith. The bending wheels 6 are each fixed on the internal sleeve 25 of its own. The transporting and crimping wheels 4, 5 are fixed with an interposed spacer disc 27 in each case jointly on an outer sleeve 26 surrounding the inner sleeve 25 and consequently are adjustable jointly, and of course the toothed wheels 4, 5, 6 associated with different connecting wires 1 are independently adjustable. The sleeves 25, 26 are each provided with a collar 28 which has a supporting diameter corresponding approximately to the root circle diameter of the corresponding tooth system, so that the toothed wheels 4, 5, 6 are supported up to approximately the base of the teeth.

To change the toothed wheels 4, 5, 6 the bearing plate 22 is removed, the clamping arrangement of the sleeves 25, 26 is released, and then the latter are removed together with the toothed wheels 4, 5, 6 through the housing aperture 23. In order to avoid collision with the tools 8, 9, 10, the cross-member can be drawn back after release of the clamping screws 29. After new toothed wheels 4, 5, 6 have been mounted and the tools 8, 9, 10 appropriately adjusted if necessary, the cross-member 14 is pushed back into its predetermined position against adjustable abutment screws 30 and secured by means of the clamping screws. The drawings do not show that also a further, additional, auxiliary cross-member for carrying further tools can be arranged above the main shaft 7, for example offset by about 90° relatively to the main cross-member 14 discussed hereinbefore.

To avoid tensile stresses on the body of the electrical component and to ensure reliable ejecting after processing, counter-holders 31 are provided which will be explained with reference to FIG. 2, which shows a set of toothed wheels and tools in an exploded view.

The counter-holder 31 constitutes essentially a flat strip which with an appropriately adapted contour at one end engages about a peripheral groove (not visible in the drawing). The counter-holder 31 has a tension relief nose 32 which co-operates with the bending finger 18 and keeps tensile stresses away from the body of the component 2. On the lower end of the counter-holder 31 there is also arranged an ejector 33 in the form of a ramp which rises radially outwardly beyond the radius of the teeth of the bending wheel 6 and whereby the components 2 are ejected after processing. The counter-holder 31 comprises at its rear end a cranked portion 34 which surrounds from below an auxiliary shaft 35 parallel to the main shaft 7. A U-shaped spring 36 presses the counter-holder 31 forwardly, so that the nose 32 co-operates with the bending finger 18, and comprises at the same time a projection 37 whereby the cranked portion 34 is held fast on the auxiliary shaft 35. When it is necessary to change toothed wheels 4, 5, 6, the counter-holder 21 can be removed in a simple manner by first taking the cranked portion 34 off the auxiliary shaft 35 and then removing the front portion of the counter-holder 31 from the toothed bending wheel 6.

As FIG. 2 also shows, the transporting and crimping wheels 4, 5, which may be arranged to precede in the direction of rotation the corresponding toothed wheels of the opposite set of toothed wheels (not shown in FIG. 2 but shown in FIG. 1), have associated with them an auxiliary counter-holder 38 which with an appropriately adapted contour at one end engages in a peripheral groove 39 of the spacer disc 27 and is supported thereby. This auxiliary counter-holder, which is also mounted on the auxiliary shaft 35 in a manner corresponding to the main counter-holder 31, comprises a crimp guide in the form of a ramp 40 which rises radially outwardly in the direction of rotation, and which is arranged in the direction of rotation between the higher crimp tool (illustrated) and the lower crimp tool (not shown). This ramp 40 is used for bringing the first-formed crimp into a specific position before the formation of the second crimp, so that as a result the crimp on the two connecting wires 1 are orientated in a precisely defined position relatively to one another. To explain, it may be mentioned that without special measures the orientation of the crimp could be subjected to certain fluctuations due to frictional forces, elastic return effects etc. By suitable formation and disposition of the ramp 40 it is possible to achieve a precisely parallel orientation of the crimp. More particularly, however, it is also possible to turn the crimp through precisely identical angles in opposite directions from the longitudinal central plane of the component 2, with the result that the connecting wires 1 are slightly offset relatively to one another and consequently sit securely and exactly perpendicularly in the holes of a circuit mounting plate.

What is claimed is:

1. Apparatus for mechanically processing the connecting wires of electrical components, the apparatus comprising toothed wheels the spaces between whose teeth receive the connecting wires which are to be processed, all of which wheels are arranged coaxially, are adapted to be driven in rotational movement by a common main shaft mounted in a housing and are adapted to be adjusted in the axial direction of the main shaft and clamped in position, the apparatus further comprising mechanical processing tools which are arranged secured to the housing and to be capable of being adjusted in the direction of the main shaft and clamped in position, and to co-operate appropriately for the processing operation in each case with respective ones of the toothed wheels, wherein the main shaft has a bearing arrangement including at least one removal end of said shaft, whereby the main shaft is releasable so that the toothed wheels can be removed from the main shaft over the removal end when their clamping to said shaft is released, and wherein the processing tools are supported directly on the housing and are adjustable independently of the toothed wheels in the axial direction of the main shaft.

2. Apparatus according to claim 1, wherein the axis of the main shaft extends through a housing aperture, the removal end is mounted in a detachable bearing plate, and the toothed wheels are removable through said housing aperture.

3. Apparatus according to claim 2, wherein the bearing plate is centered in the housing aperture.

4. Apparatus according to claim 1, wherein the toothed wheels are supported on sleeves surrounding the main shaft, on a bearing diameter which corresponds substantially to the root circle diameter of the corresponding tooth system.

5. Apparatus according to claim 1, wherein the tools are guided to be capable of displacement on a main cross-member parallel to the main shaft and are adapted to be clamped in position, and the main cross-member is adapted to be clamped fast on the housing and, when the clamping arrangement is released, to be displaced perpendicularly to the main shaft against adjustable abutments.

6. Apparatus according to claim 1, including an auxiliary cross-member for supporting additional tools, the auxiliary cross-member being arranged above the main shaft, offset by about 90° relatively to the main cross-member.

7. Apparatus according to claim 1, including at least one counter-holder associated with the toothed wheels, the counter-holder being mounted on an auxiliary shaft secured to the housing and parallel to the main shaft, being under spring action directed towards the tools and being provided with a tension relief nose and/or an ejector, the counter-holder comprising a cranked portion at its end remote from the main shaft and being mounted with the cranked portion on the auxiliary shaft, the spring acting on the counter-holder having a projection which elastically locks the cranked portion.

8. Apparatus according to claim 1, wherein said tools include a pair of crimping tools, one of which is disposed before the other in the direction of rotation of said wheels, the forward crimping tool in said direction of rotation being associated with an auxiliary counter-holder which has a crimp guide.

9. Apparatus according to claim 8, wherein said toothed wheels comprised a transporting wheel and a crimping wheel, the auxiliary counter-holder being arranged between the transporting wheel and the crimping wheel and being guided in a peripheral groove of a spacer disc which is arranged between the transporting wheel and the crimping wheel.

10. Apparatus according to claim 8, wherein the crimp guide comprises a ramp which is formed on the auxiliary counter-holder between the crimping tools in the direction of rotation of said wheels and rises radially outwardly in said direction of rotation.

* * * * *